United States Patent
Kamiya

(10) Patent No.: US 8,713,398 B2
(45) Date of Patent: Apr. 29, 2014

(54) ERROR CORRECT CODING DEVICE, ERROR CORRECT CODING METHOD, AND ERROR CORRECT CODING PROGRAM

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/823,858

(22) PCT Filed: Mar. 22, 2012

(86) PCT No.: PCT/JP2012/057301
§ 371 (c)(1),
(2), (4) Date: Mar. 15, 2013

(87) PCT Pub. No.: WO2012/128309
PCT Pub. Date: Sep. 27, 2012

(65) Prior Publication Data
US 2013/0179757 A1    Jul. 11, 2013

(30) Foreign Application Priority Data

Mar. 22, 2011    (JP) .................................. 2011-062372

(51) Int. Cl.
*H03M 13/00*    (2006.01)
(52) U.S. Cl.
USPC .......................................................... 714/752
(58) Field of Classification Search
USPC .................. 714/752, 786, 799, 776
See application file for complete search history.

(56) References Cited

U.S. PATENT DOCUMENTS

| 8,140,930 B1 * | 3/2012 | Maru ............................ 714/752 |
| 2005/0204261 A1 | 9/2005 | Kan et al. |
| 2006/0036927 A1 * | 2/2006 | Kyung et al. ................. 714/758 |
| 2006/0291571 A1 * | 12/2006 | Divsalar et al. ............... 375/242 |
| 2007/0300135 A1 * | 12/2007 | Kamiya ........................ 714/781 |
| 2008/0250295 A1 * | 10/2008 | Yamagishi et al. ........... 714/757 |
| 2009/0031186 A1 * | 1/2009 | Matsumoto et al. .......... 714/752 |
| 2009/0313523 A1 * | 12/2009 | Huang .......................... 714/752 |
| 2010/0162074 A1 * | 6/2010 | Oh et al. ....................... 714/752 |

(Continued)

FOREIGN PATENT DOCUMENTS

| JP | 2005-252820 | 9/2005 |
| JP | 2008-086008 | 4/2008 |

(Continued)

OTHER PUBLICATIONS

Robert Gallager, "Low-Density Parity-Check Codes", IEEE Transactions on Information Theory, Jan. 1962, pp. 21-28.

(Continued)

*Primary Examiner* — Albert Decady
*Assistant Examiner* — Osman Alshack
(74) *Attorney, Agent, or Firm* — Young & Thompson

(57) ABSTRACT

Disclosed are an encoding apparatus for a quasi-cyclic low-density parity check code for calculating r×m-bit redundant data for information data of length k×m bits (k, m and r are positive integers), and a cyclic addition apparatus including a k×m-bit shift register and exclusive OR. With information data of a length of k×m×L bits (L≤k), a length of (r×m×(L+1)+k×m) bits is calculated as redundant data by adding redundant data of a length of r×m×L bits calculated using the encoding apparatus L times, k×m-bit data calculated by inputting the information data of a length of k×m×L bits to the cyclic addition apparatus, and r×m-bit redundant data calculated by inputting the k×m-bit data to the encoding apparatus.

10 Claims, 9 Drawing Sheets

(56) References Cited

U.S. PATENT DOCUMENTS

| | | | |
|---|---|---|---|
| 2010/0180176 A1* | 7/2010 | Yosoku et al. | 714/752 |
| 2010/0199153 A1 | 8/2010 | Okamura et al. | |
| 2011/0191650 A1* | 8/2011 | Yokokawa | 714/752 |
| 2011/0214037 A1* | 9/2011 | Okamura et al. | 714/777 |
| 2011/0264984 A1* | 10/2011 | Murakami | 714/758 |

FOREIGN PATENT DOCUMENTS

| | | |
|---|---|---|
| JP | 2009-177775 | 8/2009 |
| WO | 2007018065 | 2/2007 |
| WO | 2007018066 | 2/2007 |
| WO | 2007132656 | 11/2007 |
| WO | 2010073922 | 7/2010 |

OTHER PUBLICATIONS

David J.C. Mackay, "Good Error-Correcting Codes Based on Very Sparse Matrices", IEEE Transactions on Information Theory, Mar. 1999, pp. 399-431.

International Search Report PCT/JP2012/057301 dated Apr. 24, 2012, with English translation.

* cited by examiner

ERROR CORRECT CODING DEVICE, ERROR CORRECT CODING METHOD, AND ERROR CORRECT CODING PROGRAM

TECHNICAL FIELD

The present invention relates to an error correction encoding apparatus (error correct coding device), an error correction encoding method (error correct coding method), and an error correction encoding program (error correct coding program), and more particularly, to a block error correction encoding apparatus for dividing an information data series into blocks of a specific length and calculating a redundant data series for each individual block, an error correction encoding method, and an error correction encoding program.

BACKGROUND ART

In satellite communications, mobile telecommunication systems, and the like, an error correction encoding technique exhibiting a large coding gain is being introduced in order to satisfy requirements in terms of system structures such as reduction of required power, reduction in the size of antennas, and the like. Particularly, low-density parity check codes are known as error correction codes that exhibit a large coding gain, and are being introduced in various types of communication systems for the satellite communications or the mobile telecommunication systems, and storage devices for magnetic recording.

The low-density parity check codes do not simply indicate a single error correction encoding method but is a general term for error correction codes having a characteristic that a check matrix is sparse (that most of components in a matrix are "0", and the number of components "1" is extremely small). It is known that an error can be corrected by using an iterative decoding method such as a sum-product algorithm, a min-sum algorithm, or the like. It is known that by setting a particularly long frame length by selecting a sparse check matrix, a coding gain which is an indicator of an error correction performance can be made large (see Non-Patent Literatures 1 and 2, for example).

Setting a long frame length possibly enables a large coding gain to be obtained. However, there are also problems that the amount of calculation required for an encoding process for generating a parity bit and a decoding process for restoring original data from data in which an error is mixed is increased, and that the cost is increased. With respect to such problems, there is known a method of simplifying a process by causing a check matrix to have regularity, and such a low-density parity check code is called a quasi-cyclic low-density parity check code.

Mathematical formula 1 below shows a typical check matrix of the quasi-cyclic low-density parity check code.

$$H = \begin{pmatrix} P_{0,0} & P_{0,1} & P_{0,2} & \cdots & P_{0,n-1} \\ P_{1,0} & P_{1,1} & P_{1,2} & \cdots & P_{1,n-1} \\ \vdots & \vdots & \vdots & & \vdots \\ \vdots & \vdots & \vdots & & \vdots \\ P_{r-1,0} & P_{r-1,1} & P_{r-1,2} & \cdots & P_{r-1,n-1} \end{pmatrix}$$ [Mathematical formula 1]

This check matrix is a block matrix of r×n (r and n are natural numbers (positive integers) satisfying r≤n), and in each component of the block matrix, $P_{i,j}$ represents a zero matrix or a cyclic permutation matrix of m×m (m is a natural number, i is an integer between 0 and r−1, and j is an integer between 0 and n−1). The frame length of a quasi-cyclic low-density parity check code having the check matrix of Mathematical formula 1 is n×m.

The quasi-cyclic low-density parity check code may simplify the encoding process and the decoding process that uses the sum-product or min-sum algorithm by using the regularity of the check matrix of Mathematical formula 1 (the cyclicity of the component matrix $P_{i,j}$). Accordingly, the frame length may be increased while suppressing the complexity of the encoding and decoding processes by increasing a size m of the cyclic permutation matrix $P_{i,j}$ (the size m is referred to as the number of stages). However, generally, with the low-density parity check code of such a structure, a large increase in the coding gain in accordance with the increase in the frame length cannot be expected. To increase the coding gain, it is desirable that n is made larger with respect to the number of stages m; however, in this case, there is a problem that the encoding and decoding processes are complicated in accordance with the increase in n.

As a technique related to the present application, Patent Literature 1 discloses a check matrix generation method adopting an LDGM (Low Density Generation Matrix) structure (paragraphs 0030, 0035, etc.), Patent Literature 2 discloses an error correction encoding method that uses low-density parity check codes (paragraph 0023, etc.), and Patent Literature 3 discloses a low-density parity check convolutional code (LDPC-CC) encoder (paragraphs 0048, etc.).

CITATION LIST

Patent Literature

{PTL 1} WO 2007/018065 A (paragraphs 0030, 0035, etc.)
{PTL 2} WO 2007/132656 A (paragraph 0023, etc.)
{PTL 3} JP 2009-177775 A
{NPL 1} Robert Gallager "Low-Density Parity-Check Codes", IEEE Transactions on Information Theory, January 1962, pp. 21-28
{NPL 2} D. J. C Mackay, "Good Error-Correcting Codes Based on very sparse matrices", IEEE Transactions on Information Theory, March 1999, pp. 399-431

SUMMARY OF INVENTION

Technical Problem

According to an error correction encoding method with low-density parity check codes, normally, a larger coding gain may be obtained as the frame length becomes longer. However, if the frame length is extremely long, there are problems that a large amount of calculation is required for the encoding and decoding processes, and that the encoding and decoding apparatuses are complicated and their scales are increased. Particularly, in a case where the frame length is increased by simply increasing the number of stages of the quasi-cyclic low-density parity check code, there is only a small improvement in the coding gain achieved in accordance with the increase in the frame length, and an essential solution is not achieved.

Object of Invention

An exemplary object of the present invention is to provide an error correction encoding apparatus according to which the frame length is long and the coding gain is large, an error correction encoding method, and an error correction encoding program, and also, to provide a small-scale error correction encoding apparatus capable of high-speed processing, according to which the frame length is short being about the same as the quasi-cyclic low-density parity check code, an error correction encoding method, and an error correction encoding program.

Solution to Problem

According to a first aspect of the present invention, there is provided an error correction encoding apparatus for calculating redundant data for error correction from information data, including:
an encoding apparatus for a quasi-cyclic low-density parity check code for calculating r×m-bit redundant data with respect to information data of a length of k×m bits (k, m and r are positive integers); and
a cyclic addition apparatus including a k×m-bit shift register and an exclusive OR, wherein the error correction encoding apparatus calculates a length of (r×m×(L+1)+k×m) bits (L is a positive integer equal to or smaller than k) as redundant data by adding redundant data of a length of r×m×L bits calculated by using the encoding apparatus L times with respect to information data of a length of k×m×L bits, k×m-bit data calculated by inputting the information data of the length of k×m×L bits to the cyclic addition apparatus, and r×m-bit redundant data calculated by inputting the k×m-bit data to the encoding apparatus.

According to a second aspect of the present invention, there is provided an error correction encoding apparatus for calculating redundant data for error correction from information data, including:
an encoding apparatus for a quasi-cyclic low-density parity check code for calculating r×m-bit redundant data with respect to information data of a length of k×m bits (k, m and r are positive integers);
a cyclic addition apparatus including a k×m-bit shift register and an exclusive OR; and
a matrix data storing table for storing a plurality of parameters for specifying a computation method of the encoding apparatus and a plurality of parameters for specifying a computation method of the cyclic addition apparatus,
wherein the error correction encoding apparatus calculates a length of (r×m×(L+1)+k×m) bits (L is a positive integer equal to or smaller than k) as redundant data by adding redundant data of a length of r×m×L bits calculated by using, L times with respect to information data of a length of k×m×L bits, maximum L+1 types of encoding apparatuses specified by parameters held in advance in the matrix data storing table, k×m-bit data calculated by inputting the information data of the length of k×m×L bits to maximum L types of cyclic addition apparatuses specified by parameters held in advance in the matrix data storing table, and r×m-bit redundant data calculated by inputting the k×m-bit data to an encoding apparatus specified by a parameter held in the matrix data storing table.

According to a third aspect of the present invention, there is provided an error correction encoding method of an error correction encoding apparatus for calculating redundant data for error correction from information data, including: calculating a length of (r×m×(L+1)+k×m) bits (L is a positive integer equal to or smaller than k) as redundant data by adding redundant data of a length of r×m×L bits calculated by applying the encoding of a quasi-cyclic low-density parity check code L times with respect to information data of a length of k×m×L bits, k×m-bit data calculated by cyclically adding the information data of the length of k×m×L bits, and r×m-bit redundant data calculated by applying the encoding of a quasi-cyclic low-density parity check code on the k×m-bit data.

According to a fourth aspect of the present invention, there is provided an error correction encoding method of an error correction encoding apparatus for calculating redundant data for error correction from information data, including:
an encoding apparatus for a quasi-cyclic low-density parity check code for calculating r×m-bit redundant data with respect to information data of a length of k×m bits (k, m and r are positive integers), a cyclic addition apparatus including a k×m-bit shift register and an exclusive OR, and a matrix data storing table for storing a plurality of parameters for specifying a computation method of the encoding apparatus for a quasi-cyclic low-density parity check code and a plurality of parameters for specifying a computation method of the cyclic addition apparatus,
wherein the error correction encoding apparatus calculates a length of (r×m×(L+1)+k×m) bits (L is a positive integer equal to or smaller than k) as redundant data by adding redundant data of a length of r×m×L bits calculated by applying, L times with respect to information data of a length of k×m×L bits, maximum L+1 types of encoding of a quasi-cyclic low-density parity check code specified by parameters held in advance in the matrix data storing table, k×m-bit data calculated by performing maximum L types of cyclic addition specified by parameters held in advance in the matrix data storing table on the information data of the length of k×m×L bits, and r×m-bit redundant data calculated by applying encoding of a quasi-cyclic low-density parity check code specified by a parameter held in the matrix data storing table on the k×m-bit data.

According to a fifth aspect of the present invention, there is provided a program for causing a computer to function as:
an encoding apparatus for a quasi-cyclic low-density parity check code for calculating r×m-bit redundant data with respect to information data of a length of k×m bits (k, m and r are positive integers), and a cyclic addition apparatus including a k×m-bit shift register and an exclusive OR,
wherein the error correction encoding apparatus calculates a length of (r×m×(L+1)+k×m) bits (L is a positive integer equal to or smaller than k) as redundant data by adding redundant data of a length of r×m×L bits calculated by using the encoding apparatus L times with respect to information data of a length of k×m×L bits, k×m-bit data calculated by inputting the information data of the length of k×m×L bits to the cyclic addition apparatus, and r×m-bit redundant data calculated by inputting the k×m-bit data to the encoding apparatus.

According to a sixth aspect of the present invention, there is provided a program for causing a computer to function as:
an encoding apparatus for a quasi-cyclic low-density parity check code for calculating r×m-bit redundant data with respect to information data of a length of k×m bits (k, m and r are positive integers), and a cyclic addition apparatus including a k×m-bit shift register and an exclusive OR;
wherein the computer includes a matrix data storing table for storing a plurality of parameters for specifying a computation method of the encoding apparatus and a plurality of parameters for specifying a computation method of the cyclic addition apparatus, and
wherein the program causes the computer to calculate, a length of (r×m×(L+1)+k×m) bits (L is a positive integer equal to or smaller than k) as redundant data by adding redundant data of a length of r×m×L bits calculated by using, L times with respect to information data of a length of k×m×L bits, maximum L+1 types of encoding apparatuses specified by parameters held in advance in the matrix data storing table, k×m-bit data calculated by inputting the information data of the length of k×m×L bits to maximum L types of cyclic addition apparatuses specified by parameters held in advance in the matrix data storing table, and r×m-bit redundant data calculated by inputting the k×m-bit data to an encoding apparatus specified by a parameter held in the matrix data storing table.

Advantages Effects of the Invention

According to the present invention, an effect that a coding gain is greatly improved by the increase in the frame length is achieved.

The main structural elements of the apparatus according to the present invention are a quasi-cyclic low-density parity check encoding apparatus of a simple structure and a short frame length, and a cyclic addition apparatus of an even simpler structure, and an encoding method with a large coding gain may be provided without an increase in the circuit scale proportional to the increase in the frame length.

DESCRIPTION OF EMBODIMENTS

Next, an embodiment of the present invention will be described in detail with reference to the drawings.

Figure 1:
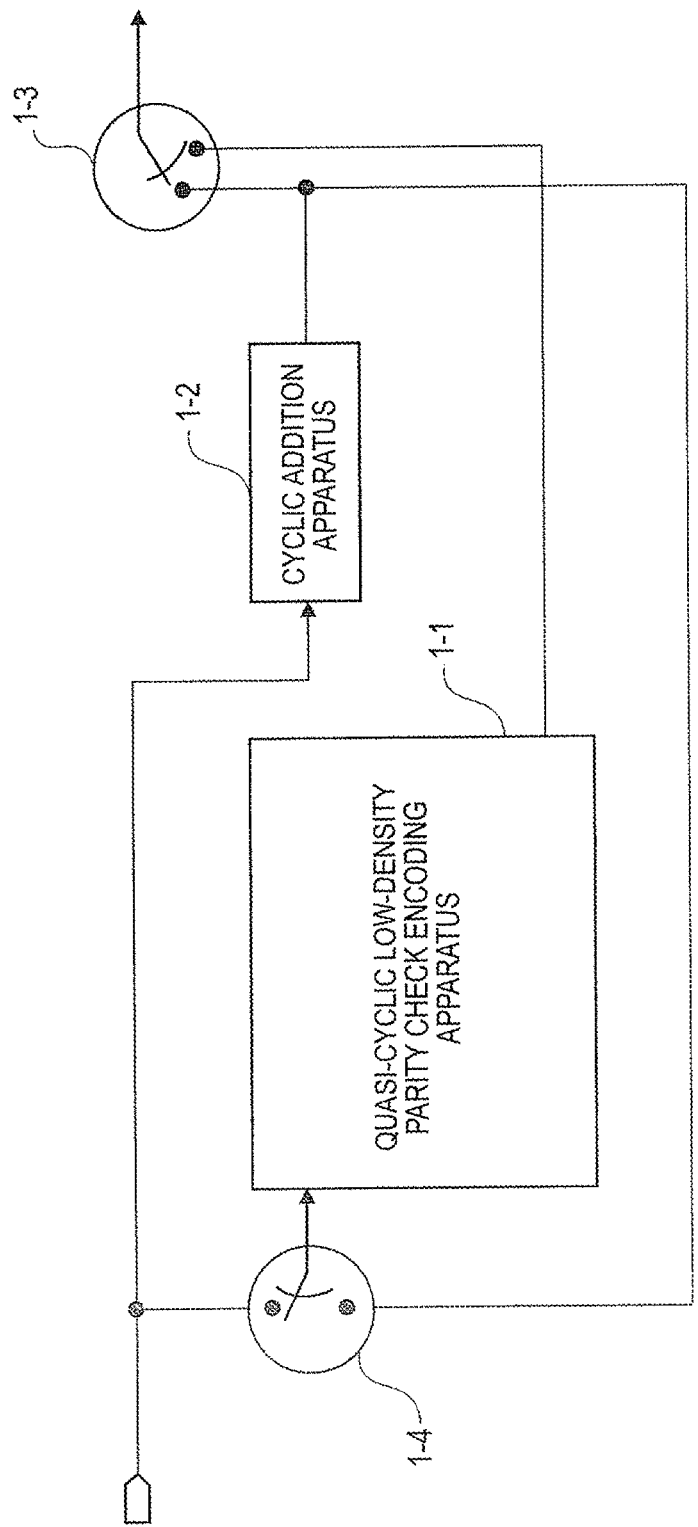
FIG. 1 A block diagram illustrates a configuration of an embodiment of an error correction encoding apparatus according to the present invention.
Figure 2:
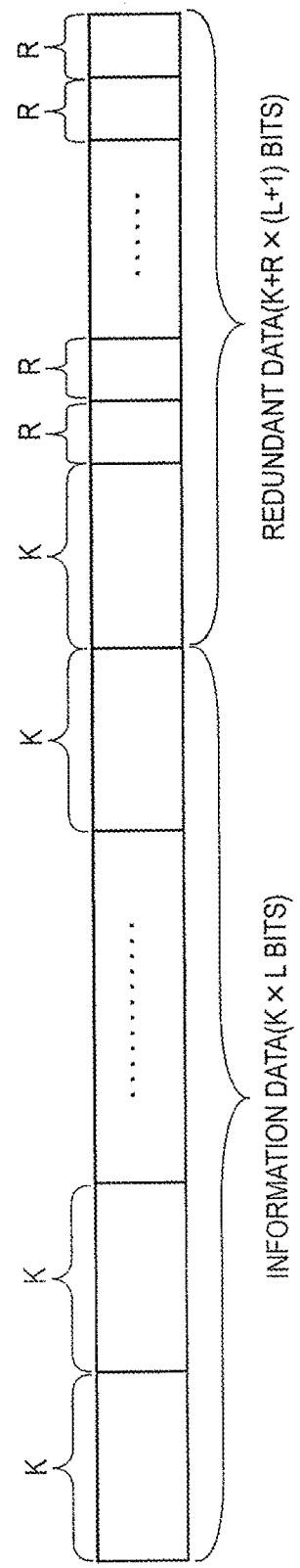
FIG. 2 A figure illustrates an example of a transmission frame structure.
Figure 9:
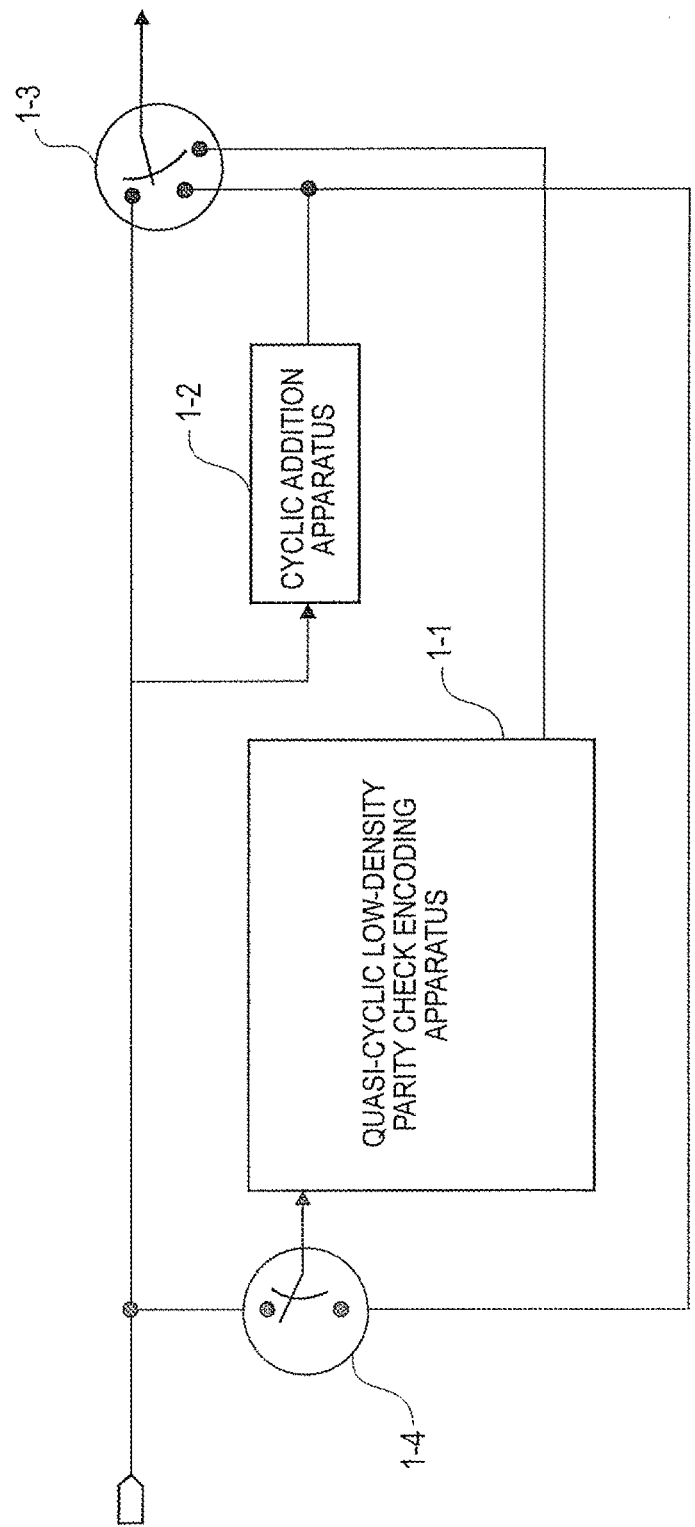
FIG. 9 A block diagram illustrates a configuration which is a modified example of an embodiment of the error correction encoding apparatus according to the present invention illustrated in FIG. 1.

FIG. 1 is a block diagram illustrating an overall configuration of an error correction encoding apparatus of an embodiment of the present invention. FIG. 9 illustrates a configuration where an information data series having a length of K×L bits may be input to or output from a switch 3 in the configuration in FIG. 1. The error correction encoding apparatus of the present embodiment has an information data series having a length of K×L bits input thereto (K and L are positive integers, K is a multiple of a positive integer m, K is equal to k×m, and L is equal to or smaller than k), and calculates a redundant data series having a length of K+R× (L+1) bits from the information data series having a length of K×L bits and outputs the same (R is a multiple of m, and R=r×m with respect to a positive integer r). In FIG. 9, the information data series is also output from the switch 1-3, and a code data series having a form illustrated in FIG. 2 is generated by combining the redundant data series and the information data series. With the configuration in FIG. 1, the code data series having a form illustrated in FIG. 2 may be generated by adding the redundant data series output from the switch 1-3 in FIG. 1 to the information data series. Although the configuration in FIG. 9 is described in the following, the operation of the configuration in FIG. 1 is the same except that the information data series is output from the switch 3.

As illustrated in FIG. 9, the error correction encoding apparatus of the present embodiment includes an encoding apparatus 1-1 for an m-stage quasi-cyclic low-density parity check code having the check matrix of Mathematical formula 1, a cyclic addition apparatus 1-2 configured from an exclusive OR, a feedback shift register and a selector, and switches 1-3 and 1-4 for switching input/output data. A memory (a storage device) may be added after the switch 1-3 as necessary to be used as a buffer used to rearrange an output order and perform output, or to adjust a delay by calculation.

The encoding apparatus 1-1 encodes an information data series having a length K into a series having a length N (N is equal to K+R, is a multiple of m, and is equal to n×m), and generates R-bit redundant data. The cyclic addition apparatus 1-2 inputs K×L-bit information data, and outputs K-bit data. The R-bit redundant data may be generated by inputting the K-bit output data from the cyclic addition apparatus 1-2 to the encoding apparatus 1-1 via the switch 1-4.

The information data having a length K×L is output via the switch 1-3. The encoding apparatus 1-1 generates R×L redundant data from the information data having a length K×L, and holds the same. The K-bit output data from the cyclic addition apparatus 1-2 is output via the switch 1-3, and is also input to the encoding apparatus 1-1 via the switch 1-4. The K-bit data is input to the encoding apparatus 1-1 to generate the R-bit redundant data, and the R-bit redundant data is added to the R×L redundant data that is held to output R×(L+1)-bit redundant data from the encoding apparatus 1-1 via the switch 1-3. A code data series of (K+R)×(L+1) bits having a form illustrated in FIG. 2 is generated by the information data having a length K×L, the K-bit data output by the cyclic addition apparatus 1-2 and the R×(L+1)-bit redundant data output in this manner.

In FIG. 9, the switch 1-3 switches between and sequentially outputs the information data having a length K×L, the K-bit data and the R×(L+1)-bit redundant data. With the configuration in FIG. 1, the switch 1-3 switches between and outputs the K-bit data and the R×(L+1)-bit redundant data.

Figure 3:
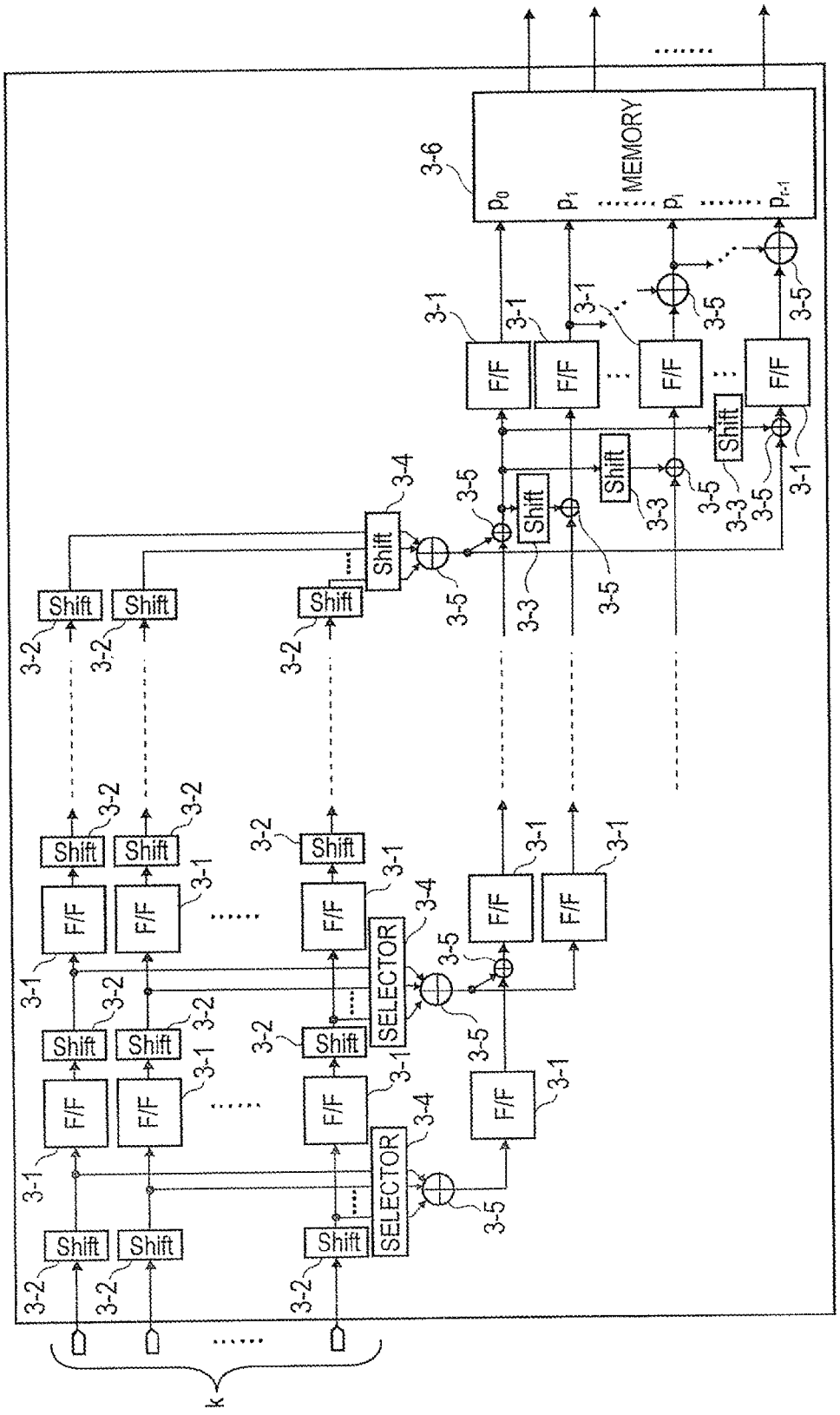
FIG. 3 A block diagram illustrates an example configuration of an encoding apparatus related to a quasi-cyclic low-density parity check code.

FIG. 3 is a block diagram illustrating an example configuration of an encoding apparatus for a quasi-cyclic low-density parity check code which is a structural element of the error correction encoding apparatus of the present embodiment. Additionally, for the sake of simplicity of description, with respect to the check matrix of Mathematical formula 1 regarding a quasi-cyclic low-density parity check code, of the matrices $P_{i,j}$ which are the components (i is an integer between 0 and r−1, and j is an integer between 0 and n−1), r−1 column blocks from the left are assumed to be of a dual diagonal type of Mathematical formula 2 below.

[Mathematical formula 2]

$$H = \begin{pmatrix} P_{0,0} & P_{0,1} & \ldots & \ldots & P_{0,k-1} & P_{0,k} & I & & & 0 \\ P_{1,0} & P_{1,1} & \ldots & \ldots & P_{1,k-1} & P_{1,k} & I & I & & \\ & & & & & & I & \ddots & & \\ \vdots & \vdots & & & \vdots & \vdots & & \ddots & \ddots & \\ \vdots & \vdots & & & \vdots & \vdots & & & \ddots & I \\ & & & & & & & & I & I \\ P_{r-1,0} & P_{r-1,1} & \ldots & \ldots & P_{r-1,k-1} & P_{r-1,k} & 0 & & & I \end{pmatrix}$$

Here, I represents m×m identity matrix. Also, it is assumed that $P_{0,k}+P_{1,k}+ \ldots +P_{r-1,k}=I$ is satisfied for the r-th column block $(P_{0,k}, P_{1,k}, \ldots, P_{r-1,k})^T$ from the left. The apparatus in FIG. 3 includes, in addition to maximum k×(r−1)+r×(r−1)/2 pieces of m-bit registers 3-1, maximum k×(r−1)+r×(r−1)/2 pieces of m-bit cyclic shift circuits 3-2 and 3-3, and maximum r pieces of selector circuits 3-4, an exclusive OR circuit 3-5, and a memory 3-6.

Figure 4:
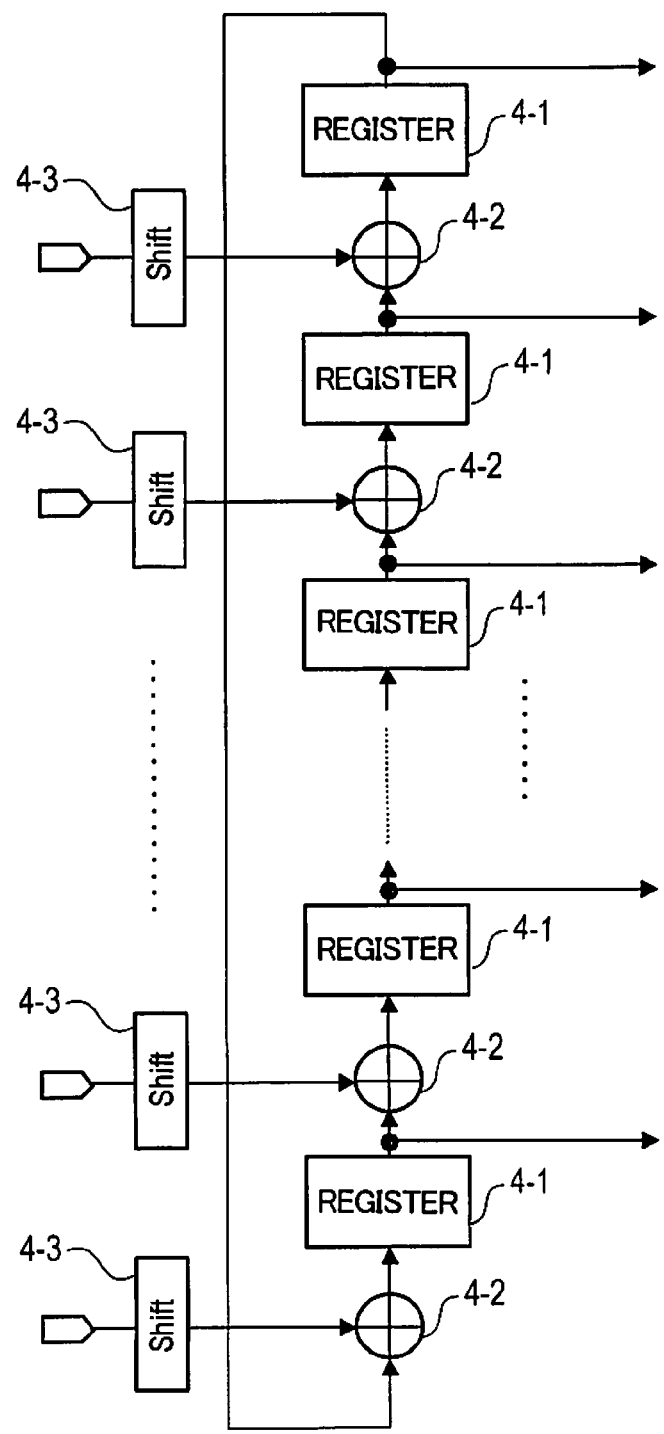
FIG. 4 A block diagram illustrates an example configuration of a cyclic addition apparatus.

FIG. 4 is a block diagram illustrating an example configuration of the cyclic addition apparatus, which is a structural element of the error correction encoding processing apparatus of the present embodiment. There are included k pieces of registers 4-1 and exclusive OR circuits 4-2, and cyclic shift circuits 4-3, and k-block data is input (one block is equal to in bits), and is exclusive OR added to m-bit data held by each of k pieces of registers, and is held in the register.

[Description of Operation]

An operation of the error correction encoding apparatus illustrated in FIG. 9 will be described. The operation of the error correction encoding apparatus illustrated in FIG. 1 is the same except that an information data series having a length of K×L bits is not output from the switch 1-3. With the error correction encoding apparatus of the present embodiment illustrated in FIG. 9, an information data series having a length of K×L bits is input and is output as it is, and then, a redundant series having a length of K+R×(L+1) bits which has been calculated by the error correction encoding apparatus is output. Here, K and R are positive integers, and are expressed by K=k×m and R=r×m by positive integers m, k and r. Also, L is a positive integer equal to or smaller than the positive integer k. The overall frame including the information series and the redundant series is formed from (K+R)×(L+1) bits as illustrated in FIG. 2.

Figure 6:
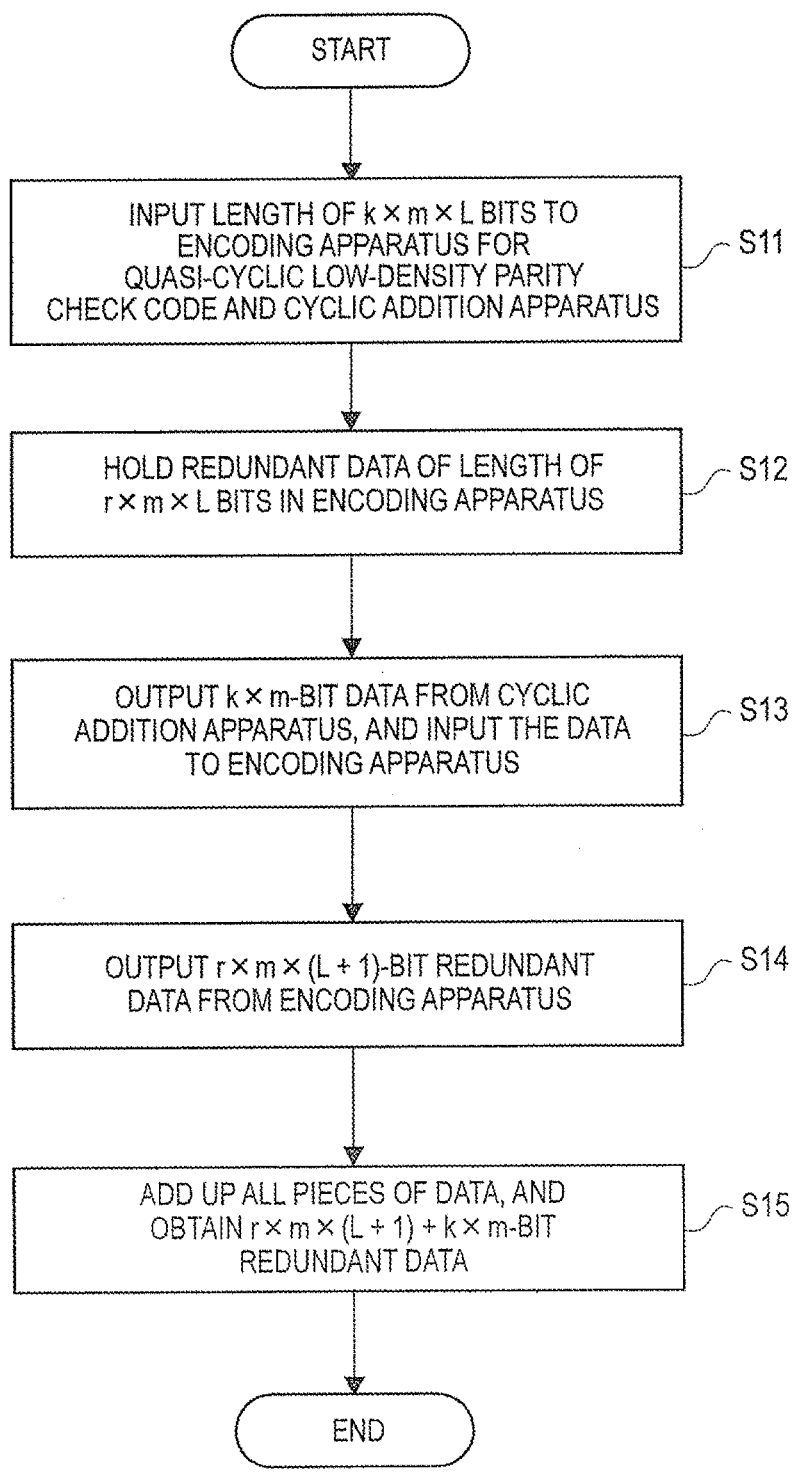
FIG. 6 A flow chart illustrates operations of a cyclic addition apparatus and an encoding apparatus of the error correction encoding apparatus according to the present invention.

With the error correction encoding apparatus an example configuration of which is illustrated in FIG. 9, an information series having a length of K×L bits may be input maximum K bits at a time by the number of times L at the minimum, and for the sake of simplicity of description, a case is described below using FIG. 6 where input and processing are performed L times on a K-bit basis.

The K×L-bit information series is input K bits at a time, and K-bit data which is input is output via the switch 1-3. Furthermore, the input K-bit data is input to the encoding apparatus 1-1 for a quasi-cyclic low-density parity check code via the switch 1-4, and is also input to the cyclic addition apparatus 1-2 (step S11). When all of the K×L-bit information series has been input after L times, the switch 1-3 is switched to the terminal in the middle and the switch 1-4 is switched to a lower terminal. Here. R×L redundant data is generated and held in the encoding apparatus 1-1 for a quasi-cyclic low-density parity check code (step S12). Next, K-bit redundant data is output from the cyclic addition apparatus 1-2, and is output via the switch 1-3, and also, input to the encoding apparatus 1-1 for quasi-cyclic low-density parity check coding via the switch 1-4 (step S13). By adding R-bit redundant data generated by the quasi-cyclic low-density parity check encoding apparatus 1-1 using the input K-bit redundant data to the R×L redundant data which is held, R×(L+1)-bit redundant data is obtained. Lastly, the switch 1-3 is switched to the lowest position, and the R×(L+1)-bit redundant data is output from the quasi-cyclic low-density parity check encoding apparatus 1-1 (step S14). When the R×(L+1)-bit redundant data is added to the K×L-bit data and K-bit redundant data that were output first, a (K+R)×(L+1)-bit redundant series is obtained (step S15).

The encoding apparatus for a quasi-cyclic low-density parity check code in FIG. 3 calculates R-bit redundant data with respect to the K-bit data. As described above, K is equal to k×m, and R is equal to r×m. The K-bit input data is expressed by k-block data $u_0, u_1, \ldots, u_{k-1}$ (one block is m bits), and the R-bit redundant data is expressed by r-block data $p_0, p_1, \ldots, p_{r-1}$.

The k-block data $u_0, u_1, \ldots, u_{k-1}$ is input from k pieces of input terminals illustrated in the upper left of FIG. 3, and each input block is cyclic shifted by the cyclic shift circuit 3-2. For example, block data $u_i=u_{i,0}\, u_{i,1} \ldots u_{i,m-1}$ is cyclic shifted by the cyclic shift circuit in the manner shown by Mathematical formula 3 below (i is an integer between 0 and k−1).

$$u_i = u_{i,0} u_{i,1} \ldots u_{i,h-1} u_{i,h} u_{i,h+1} \ldots u_{i,m-1} \quad \text{[Mathematical formula 3]}$$
$$\downarrow$$
$$u_i' = u_{i,h} u_{i,h+1} \ldots u_{i,m-1} u_{i,0} u_{i,1} \ldots u_{i,h-1}$$

The amount of shift in Mathematical formula 3 is h (h is an integer between 0 and m−1), and the amount of each shift is specified by an m×m matrix $P_{i,j}$, which is a component of the check matrix of Mathematical formula 2. The component matrix $P_{i,j}$ is a zero matrix or a cyclic permutation matrix of a form shown by Mathematical formula 4.

$$\begin{pmatrix} & 0 & 1 & \ldots & \ldots & h & h+1 & \ldots & m-1 \\ 0 & & & & & 1 & & & \\ 1 & & & & & & 1 & & \\ \vdots & & & & & & & \ddots & \\ \vdots & & & & & & & & 1 \\ m-h-1 & 1 & & & & & & & \\ m-h & & 1 & & & & & & \\ \vdots & & & \ddots & & & & & \\ \vdots & & & & \ddots & & & & \\ m-1 & & & & & 1 & & & \end{pmatrix} \quad \text{[Mathematical formula 4]}$$

Additionally, the empty part in the matrix of Mathematical formula 4 is assumed to be zero. The correspondence between the component matrix and the amount of shift of the cyclic shift circuit 3-2 in FIG. 3 will be described. It is assumed that v(i,j) is a non-zero component position of a highest row vector of the matrix $P_{i,j}$. In the case the matrix $P_{i,j}$ is the cyclic permutation matrix of Mathematical formula 4, v(i,j) is equal to h. Also, in the case $P_{i,j}$ is a zero matrix, v(i,j) is assumed to be equal to 0 for the sake of convenience.

According to an example of apparatus configuration illustrated in FIG. 3, a total of k×r pieces of cyclic shift circuits 3-2 are arranged at the upper stage in the drawing along k pieces of input terminals, and a total of r−1 pieces of cyclic shift circuits 3-3 are arranged at the lower stage.

With respect to the k×r pieces of cyclic shift circuits 3-2 arranged in the upper stage, the amount of shift is v(r−1, 0), v(r−1, 1), ..., v(r−1, k−1) from the top for k pieces of cyclic shift circuits 3-2 positioned at the left end column near the input terminals. Also, the amount of shift is v(0, 0)−v(r−1, 0), v(0, 1)−v(r−1, 1), ..., v(0, k−1)−v(r−1, k−1) from the top for k pieces of cyclic shift circuits positioned at the second column from left. In the same manner, the amount of shift is v(t−2, 0)−v(t−3, 0), v(t−2, 1)−v(t−3, 1), v(t−2, k−1)−v(t−3, k−1) from the top for k pieces of cyclic shift circuits positioned at the t-th column from the left (t is an integer between 3 and r). Additionally, when the amount of shift is zero, since it is identity transformation, the cyclic shift circuit 3-2 may be omitted.

Also, the amount of shift is v'(0, k), v'(1, k), ..., v'(r−2, k) from the left in FIG. 3 for r−1 pieces of cyclic shift circuits 3-3 arranged at the lower stage. Additionally, in the case $P_{i,k}$ is not a zero matrix, v'(i, k) is the same as v(i, k) mentioned above (i is an integer between 0 and r−2), and in the case $P_{i,k}$ is a zero matrix, the corresponding cyclic shift circuit 3-3 in FIG. 3 outputs zero regardless of input (the same as no connection).

The k-block input data $u_0, u_1, \ldots, u_{k-1}$ is sequentially cyclic shifted by the cyclic shift circuit 3-2 whose amount of shift is determined by the method described above, and also, an exclusive OR operation is performed on a bit-by-bit basis by the exclusive OR circuit 3-5 via the selector 3-4. Here, the selector 3-4 performs selection such that the exclusive OR circuit 3-5 at the following stage performs the operation only if the matrix $P_{i,j}$ corresponding to the cyclic shifting is formed from the cyclic permutation matrix of Mathematical formula 4. That is, the selector 3-5 positioned at the left end in FIG. 3 selects only the output of the cyclic shift circuit corresponding to the cyclic permutation matrix having the form of Mathematical formula 4 among the component matrices $P_{r-1,0}, P_{r-1,1}, \ldots, P_{r-1,k-1}$ in Mathematical formula 2, and in the case there is a zero matrix among $P_{r-1,0}, P_{r-1,1}, \ldots, P_{r-1,k-1}$, the selector does not select the output of the cyclic shift circuit corresponding to the zero matrix. Also, the second selector from the left in FIG. 3 selects only the output of the cyclic shift circuit corresponding to the cyclic permutation matrix having the form of Mathematical formula 4 among the component matrices $P_{0,0}, P_{0,1}, \ldots, P_{0,k-1}$ in Mathematical formula 2, and in the case there is a zero matrix among $P_{0,0}, P_{0,1}, \ldots, P_{0,k-1}$, the selector does not select the output of the cyclic shift circuit corresponding to the zero matrix. In the same manner, the t-th selector from the left in FIG. 3 selects only the output of the cyclic shift circuit corresponding to the cyclic permutation matrix having the form of Mathematical formula 4 among the component matrices $P_{t-2,0}, P_{t-2,1}, \ldots, P_{t-2,k-1}$ in Mathematical formula 2, and in the case there is a zero matrix among $P_{t-2,0}, P_{t-2,1}, \ldots, P_{t-2,k-1}$, the selector does not select the output of the cyclic shift circuit corresponding to the zero matrix (t is an integer between 3 and r).

According to the configuration described above, the outputs of the exclusive OR circuits 3-5 positioned at the outputs of r pieces of selectors 3-4 in FIG. 3 match $w_0, w_1, \ldots, w_{r-1}$ shown in Mathematical formula 5 below.

$$w_i = \sum_{j=0}^{k-1} P_{i,j} \cdot u_j^T, i = 0, 1, \ldots, r-1 \quad \text{[Mathematical formula 5]}$$

Additionally, of the r pieces of exclusive OR circuits 3-5, the output of the circuit at the left end matches $w_{r-1}$, and the output of the second circuit from the left matches $w_0$. In the same manner, the output of the t-th circuit from the left matches (t is an integer between 3 and r). Redundant data of r blocks $p_0, p_1, \ldots, p_{r-1}$ is calculated from $w_0, w_1 \ldots, w_{r-1}$ in Mathematical formula 5 by Mathematical formula 6 shown below.

$$p_0 = \sum_{i=0}^{r-1} w_i \quad \text{[Mathematical formula 6]}$$
$$p_1 = w_0 + P_{0,k} \cdot p_0$$
$$p_2 = w_1 + P_{1,k} \cdot p_0 + p_1$$
$$\vdots$$
$$p_{r-1} = w_{r-1} + P_{r-2,k} \cdot p_0 + p_{r-2}$$

The cyclic shift circuits 3-3 and the registers of r rows at the lower stage of the apparatus illustrated in FIG. 3 calculate $p_0, p_1, \ldots, p_{r-1}$, and the memory 3-6 holds the same. By performing the same operation L times, R×L-bit redundant data is held in the memory 3-6 with respect to the K×L-bit input data.

At the same time as inputting the K×L-bit data input to the apparatus in FIG. 9 of the present embodiment to the encoding apparatus 1-1 (FIG. 3) for a quasi-cyclic low-density parity check code and calculating the R×L-bit redundant data, the K×L-bit input data is input to the cyclic addition apparatus 1-2.

Like the quasi-cyclic low-density parity check encoding apparatus in FIG. 3, according to the cyclic addition apparatus an example configuration of which is illustrated in FIG. 4, k-block data $u_0, u_1, \ldots, u_{k-1}$ is input (one block is equal to m bits). The input k-block data is cyclic shifted by each cyclic shift circuit 4-3, is exclusive ORed with m-bit data held by each of k pieces of registers that are circularly connected, and is then held by the registers. Additionally, the initial value of each register is assumed to be zero. By inputting and processing the K×L-bit data in units of K bits (=k blocks) over L times, the k-block data calculated with respect to the K×L-bit input data is held by k pieces of registers in FIG. 4.

After the K×L-bit data is input, the k-block data held by the k pieces of registers of the cyclic addition apparatus in FIG. 4 is output from the error correction encoding apparatus of the present embodiment via the switch 1-3, and is also input to the quasi-cyclic low-density parity check encoding apparatus 1-1 (FIG. 3) via the switch 1-4. In exactly the same manner as the operation described in the description of the operation of the quasi-cyclic low-density parity check encoding apparatus the example configuration of which is illustrated in FIG. 3, r-block redundant data is calculated from the k-block data which is the output of the cyclic addition apparatus in FIG. 4, and is held in the memory 3-6. The redundant data held in the memory 3-6 will be R×(L+1) bits in total.

After the k-block data held in the register of the cyclic addition apparatus in FIG. 4 is output, via the switch 1-3, as a part of the redundant data calculated by the error correction encoding apparatus in FIG. 9, the R×(L+1)-bit redundant data held in the memory 3-6 in the quasi-cyclic low-density parity check encoding apparatus is sequentially output.

With the operation described above, the encoding apparatus of the present embodiment (FIG. 9) calculates K+R×(L+1)-bit redundant data with respect to the K×L-bit information data, and outputs the same in the frame format an example of which is illustrated in FIG. 2.

Figure 5:
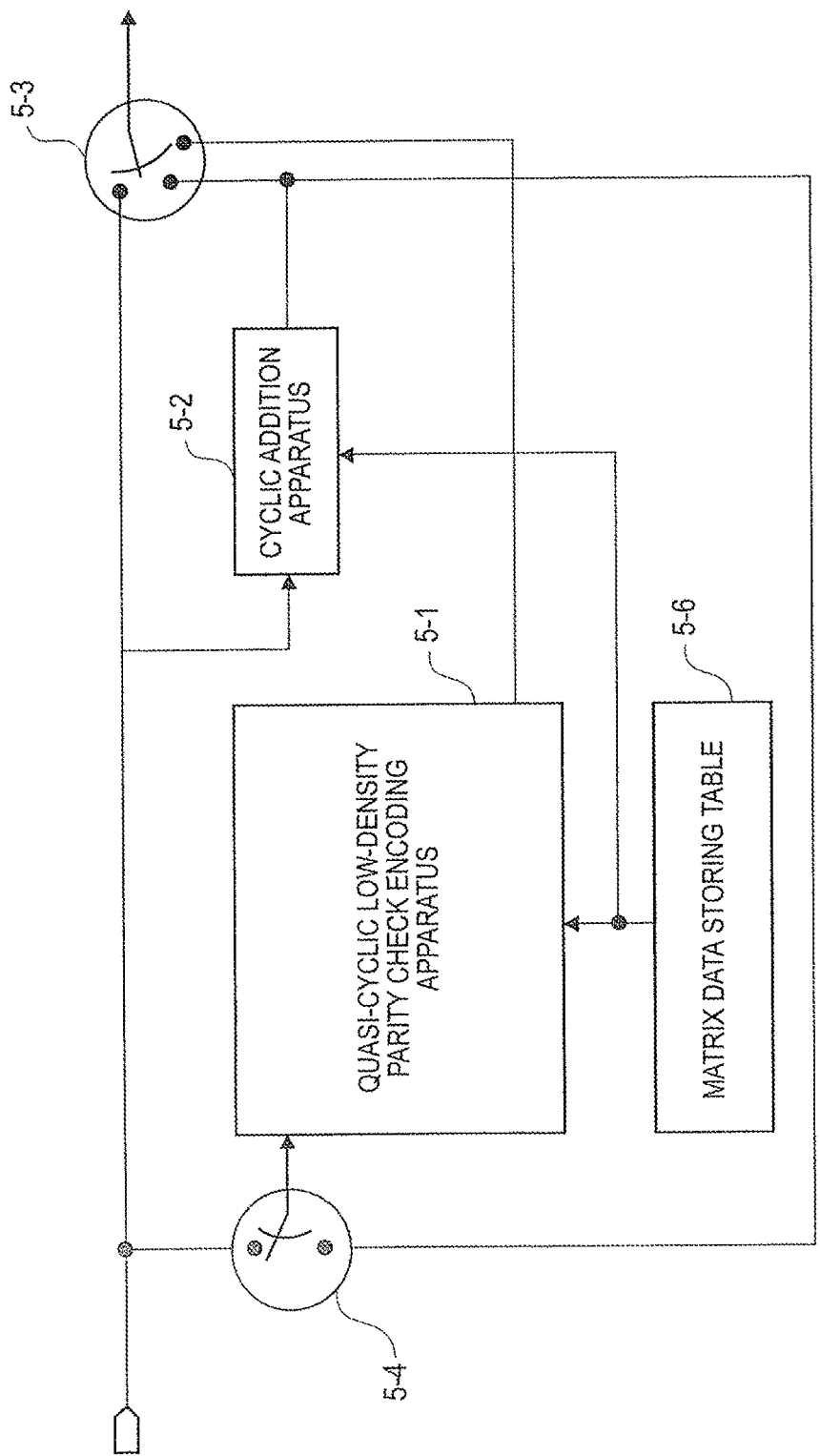
FIG. 5 A block diagram illustrates another embodiment related to the error correction encoding apparatus according to the present invention.

A block diagram illustrating an example of another embodiment of the error correction encoding apparatus of the present invention is illustrated in FIG. 5. Like that in FIG. 9, the error correction encoding apparatus in FIG. 5 is configured to include a quasi-cyclic low-density parity check encoding apparatus 5-1, a cyclic addition apparatus 5-2, and switches 5-3 and 5-4, and in addition, a matrix data storing table 5-6.

The matrix data storing table 5-6 holds maximum (L+1) types of amounts of shift of the cyclic shift circuits 3-2 and 3-3 determined by the method described above from the matrix $P_{i,j}$ (i is an integer between 0 and r−1, and j is an integer between 0 and k) which is the component matrix of the check matrix H shown by Mathematical formula 2 and maximum (L+1) types of selection patterns of the selectors 3-4 and also, maximum L types of amounts of shift of the cyclic shift circuits 4-3 of the cyclic addition apparatus (FIG. 4). These pieces of data are supplied to the quasi-cyclic low-density parity check encoding apparatus 5-1 and the cyclic addition apparatus 5-2.

The configuration and the operation of the quasi-cyclic low-density parity check encoding apparatus are the same as those described using the example configuration in FIG. 3, and input data is processed in units of k blocks, and r-block data is held in a memory. Here, by installing the matrix data storing table 5-6, the amounts of shift of the cyclic shift circuits 3-2 and 3-3 and the selection patterns of the selectors may be changed for each k-block input without the amounts of shift and the selection patterns being fixed. Accordingly, an encoding apparatus for an error correction code with an improved error correction performance may be obtained.

The same can be said for the cyclic addition circuit (FIG. 4), and by making the amount of shift of the cyclic shift circuit 4-3 variable depending on the data held in the matrix data storing table 5-6 for each input of k-block data, an encoding apparatus for an error correction code with an improved error correction performance may be obtained compared to when the amount of shift is fixed.

Next, the error correction encoding apparatus (FIG. 9) will be described using specific example numerical values. Assuming that m is 31, k is 32, r is 5 and L is 31 with respect to the positive integers, m, k, r and L, K=k×m=32×31=992 and R=r×m=5×31=155 are obtained, and the error correction encoding apparatus of the present embodiment calculates redundant data of K+R×(L+1)=992+155×32=5952 bits with respect to information data of K×L=992×31=30752 bits. Since a transmission frame includes 30752+5952=36704 bits in total, the encoding apparatus of the present embodiment is an encoding apparatus for a (36704, 30752) code. The code rate indicating the proportion of information bits in a transmission frame is about 84%.

The quasi-cyclic low-density parity check encoding apparatus 1-1 of the present embodiment calculates redundant data of 155 bits with respect to information of K=992 bits, and is thus an encoding apparatus for a (1147, 992) code. The error correction encoding apparatus for a (36704, 30752) code according to the present embodiment has a simple configuration where a cyclic addition apparatus is provided to the encoding apparatus for a (1147, 992) code whose length is 1/32, and it is therefore possible to provide an encoding method that exhibits a large coding gain without increasing the circuit scale in proportion to the increase in the frame length. The (36704, 30752) code may correct an error by using an iterative decoding method such as the sum-product algorithm or the min-sum algorithm, and in the case a binary phase shift keying method is used in an additive white noise channel, a very high coding gain of about 0.9 dB to the theoretical limit may be obtained.

As described above, the error correction encoding apparatus according to the present embodiment is effective in increasing the speed of the encoding process and in reducing the power consumption at the time of the encoding process, for example, and is effective when used under conditions that are severe with respect to circuit resources, power consumption and the like, as in the case of installation on a satellite or the like.

Figure 7:
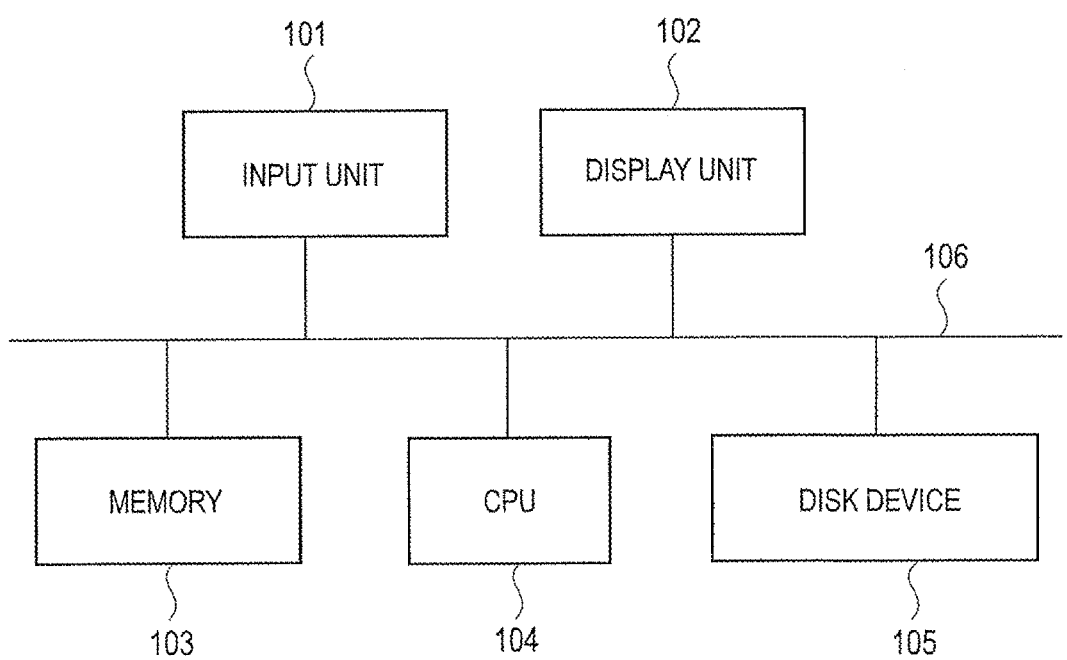
FIG. 7 A figure illustrates an example of a computer that operates as an error correction encoding apparatus by a program according to the present invention.

The error correction encoding apparatus according to the present embodiment is configured from hardware such as a dedicated IC. However, it is also possible to realize the functions of all or a part of the configuration illustrated in FIG. 1 or FIG. 9 by software using a computer. That is, the present invention may be realized as a program. FIG. 7 is a diagram illustrating an example of a computer that operates as an error correction encoding apparatus by the program according to the present invention.

The functions of the error correction encoding apparatus of the present embodiment may be realized by programs by configuring a computer with a CPU 104, a disk device (or storage means such as a ROM) 105 such as a hard disk, an input unit 101 such as a keyboard, a memory 103 such as a RAM, and a display unit 102 such as a liquid crystal display, writing the operations of the quasi-cyclic low-density parity check encoding apparatus 1-1 and the cyclic addition apparatus 1-2 and the switching operations of the switches 1-3 and 1-4 as programs, storing these programs in the disk device 105 such as a hard disk, storing information necessary for computation in the memory 103 such as a RAM, and causing the programs to operate on the CPU 104. A reference sign 106 is a bus connecting each unit. The programs are recorded in a computer-readable recording medium such as a DVD, a CD-ROM or a USB memory and are installed on a hard disk to be loaded on the computer.

Figure 8:
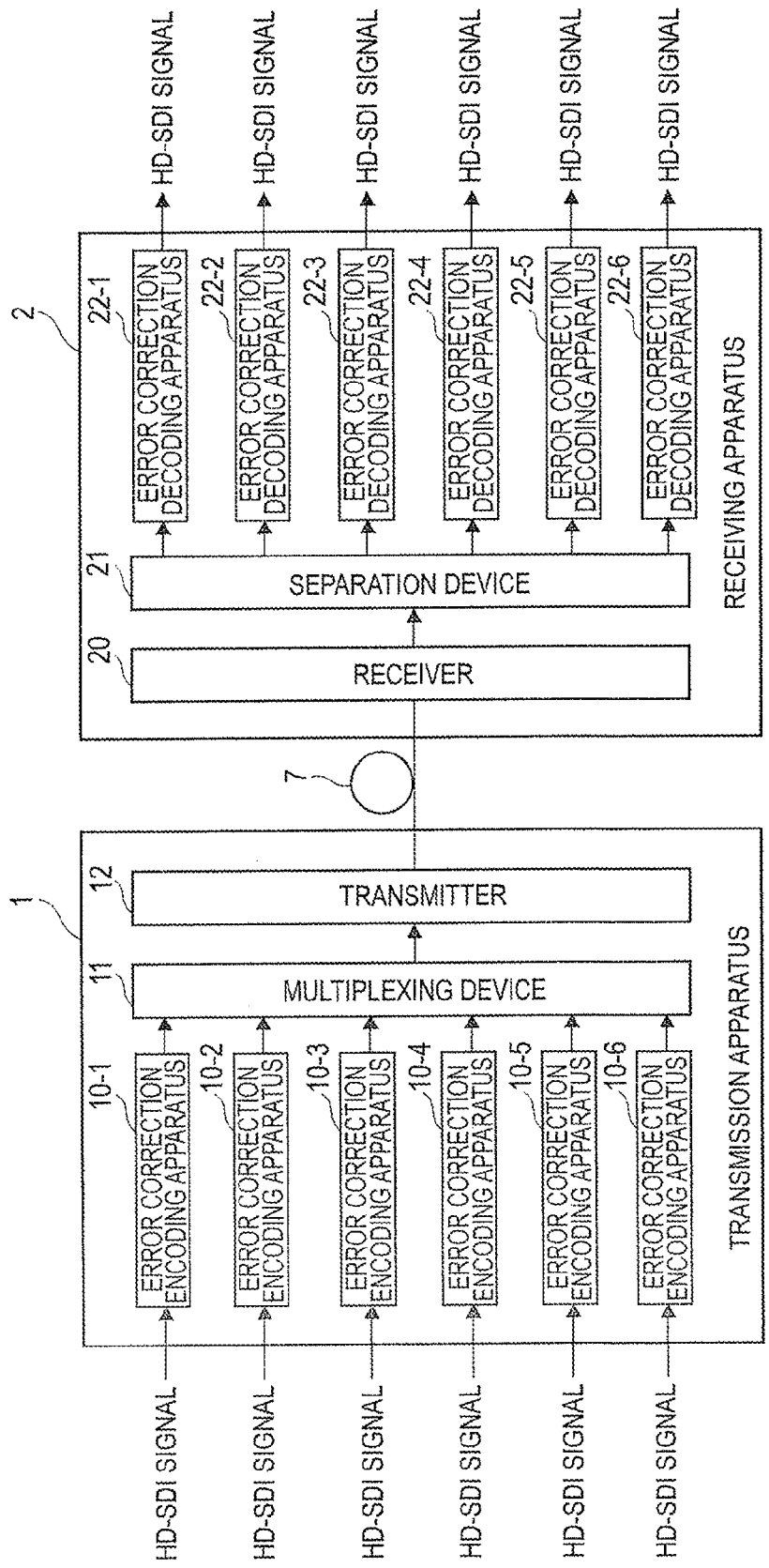
FIG. 8 A block diagram illustrates an example where the error correction encoding apparatus of the embodiment is used as a transmission apparatus.

The present embodiment is effective in increasing the speed of the encoding process and in reducing the power consumption at the time of the encoding process, for example, and is effective when used under conditions that are severe with respect to circuit resources, power consumption and the like, as in the case of installation on a satellite or the like. FIG. 8 is a block diagram illustrating an example where the error correction encoding apparatus of the present embodiment is used as a transmission apparatus. FIG. 8 illustrates a transmission apparatus configured from a transmission apparatus 1, a receiving apparatus 2, and a transmission channel 7 connecting the transmission apparatus 1 and the receiving apparatus 2. The configuration of this transmission apparatus is disclosed in FIG. 3 of JP 2011-223395 A, and the details are disclosed in JP 2011-223395 A.

An input HD-SDI signal is encoded by each of error correction encoding apparatuses 10-1 to 10-6. The error correction encoding apparatus of the present embodiment is used as the error correction encoding apparatuses 10-1 to 10-6. The HD-SDI signals encoded by the error correction encoding apparatuses 10-1 to 10-6 are multiplexed by a multiplexing device 11, and transmitted by a transmitter 12 to the receiving apparatus 2 via the transmission channel 7. The multiplexed signal is separated at the receiving apparatus 2 by a receiver, and the signals are decoded by error correction decoding apparatuses 22-1 to 22-6. Additionally, the HD-SDI signal is a signal according to a serial digital interface standard for multiplexing, and transmitting, non-compressed HDTV video and audio signal, standardized by SMPTE (Society of Motion Picture and Television Engineers) as 292M. Additionally, the example configuration in FIG. 8 illustrates an example where the error correction encoding apparatus of the present embodiment is applied to a transmission apparatus, and the configuration or the use is not limited to such an example.

Furthermore, although the embodiments described above are preferred embodiments of the present invention, the scope of the present invention is not limited to the embodiments, and the present invention may be embodied in other forms with various modifications without departing from the spirit of the present invention. Thus, each embodiment described above is only an example, and is to be considered as not restrictive. The scope of the present invention is indicated by the appended claims, and is not restricted by the description or the abstract. Moreover, all modifications and changes within the range of equivalency of the claims are to be embraced within the scope of the present invention.

The present application is based upon and claims the benefit of priority from Japanese Patent Application No. 2011-062372, filed on Mar. 22, 2011. The entire disclosure of Japanese Patent Application No. 2011-062372 is incorporated herein by reference in its entirety.

The whole or a part of the embodiments described above may be described as the following supplementary notes, but is not limited thereto.

{Supplementary Note 1}

An error correction encoding apparatus for calculating redundant data for error correction from information data, comprising:

an encoding apparatus for a quasi-cyclic low-density parity check code for calculating r×m-bit redundant data with respect to information data of a length of k×m bits (k, m and r are positive integers); and a cyclic addition apparatus including a k×m-bit shift register and an exclusive OR, wherein the error correction encoding apparatus calculates a length of (r×m×(L+1)+k×m) bits (L is a positive integer equal to or smaller than k) as redundant data by adding redundant data of a length of r×m×L bits calculated by using the encoding apparatus L times with respect to information data of a length of k×m×L bits, k×m-bit data calculated by inputting the information data of the length of k×m×L bits to the cyclic addition apparatus, and r×m-bit redundant data calculated by inputting the k×m-bit data to the encoding apparatus.

{Supplementary Note 2}

An error correction encoding apparatus for calculating redundant data for error correction from information data, comprising:

an encoding apparatus for a quasi-cyclic low-density parity check code for calculating r×m-bit redundant data with respect to information data of a length of k×m bits (k, m and r are positive integers);

a cyclic addition apparatus including a k×m-bit shift register and an exclusive OR; and a matrix data storing table for storing a plurality of parameters for specifying a computation method of the encoding apparatus and a plurality of parameters for specifying a computation method of the cyclic addition apparatus, wherein the error correction encoding apparatus calculates a length of (r×m×(L+1)+k×m) bits (L is a positive integer equal to or smaller than k) as redundant data by adding redundant data of a length of r×m×L bits calculated by using, L times with respect to information data of a length of k×m×L bits, maximum L+1 types of encoding apparatuses specified by parameters held in advance in the matrix data storing table, k×m-bit data calculated by inputting the information data of the length of k×m×L bits to maximum L types of cyclic addition apparatuses specified by parameters held in advance in the matrix data storing table, and r×m-bit redundant data calculated by inputting the k×m-bit data to an encoding apparatus specified by a parameter held in the matrix data storing table.

{Supplementary Note 3}

The error correction encoding apparatus according to Supplementary note 1 or 2, further comprising:

a first switch for outputting an output of the cyclic addition apparatus or an output of the encoding apparatus; and a second switch for inputting the information data of the length of k×m×L bits or the output of the cyclic addition apparatus to the encoding apparatus, wherein the k×m-bit data is output, via the first switch, from the cyclic addition apparatus to which the information data of a length of k×m×L bits has been input, the information data of a length of k×m×L bits is input to the encoding apparatus via the second switch, and the redundant data of a length of r×m×L bits is generated and held at the encoding apparatus, r×m×(L+1) redundant data is generated by adding, to the r×m×L-bit redundant data, r×m-bit redundant data generated by inputting the k×m-bit data from the cyclic addition apparatus to the encoding apparatus by switching the second switch, and the r×m×(L+1) redundant data is output from the encoding apparatus by switching the first switch.

{Supplementary Note 4}

An error correction encoding method of an error correction encoding apparatus for calculating redundant data for error correction from information data, comprising:

calculating a length of (r×m×(L+1)+k×m) bits (L is a positive integer equal to or smaller than k) as redundant data by adding redundant data of a length of r×m×L bits calculated by applying the encoding of a quasi-cyclic low-density parity check code L times with respect to information data of a length of k×m×L bits, k×m-bit data calculated by cyclically adding the information data of the length of k×m×L bits, and r×m-bit redundant data calculated by applying the encoding of a quasi-cyclic low-density parity check code on the k×m-bit data.

{Supplementary Note 5}

An error correction encoding method of an error correction encoding apparatus for calculating redundant data for error correction from information data, comprising:

an encoding apparatus for a quasi-cyclic low-density parity check code for calculating r×m-bit redundant data with respect to information data of a length of k×m bits (k, m and r are positive integers), a cyclic addition apparatus including a k×m-bit shift register and an exclusive OR, and a matrix data storing table for storing a plurality of parameters for specifying a computation method of the encoding apparatus for a quasi-cyclic low-density parity check code and a plurality of parameters for specifying a computation method of the cyclic addition apparatus, wherein the error correction encoding apparatus calculates a length of (r×m×(L+1)+k×m) bits (L is a positive integer equal to or smaller than k) as redundant data by adding redundant data of a length of r×m×L bits calculated by applying, L times with respect to information data of a length of k×m×L bits, maximum L+1 types of encoding of a quasi-cyclic low-density parity check code specified by parameters held in advance in the matrix data storing table, k×m-bit data calculated by performing maximum L types of cyclic addition specified by parameters held in advance in the matrix data storing table on the information data of the length of k×m×L bits, and r×m-bit redundant data calculated by applying encoding of a quasi-cyclic low-density parity check code specified by a parameter held in the matrix data storing table on the k×m-bit data.

{Supplementary Note 6}

A program for causing a computer to function as:

an encoding apparatus for a quasi-cyclic low-density parity check code for calculating r×m-bit redundant data with respect to information data of a length of k×m bits (k, m and r are positive integers), and a cyclic addition apparatus including a k×m-bit shift register and an exclusive OR, wherein the error correction encoding apparatus calculates a length of (r×m×(L+1)+k×m) bits (L is a positive integer equal to or smaller than k) as redundant data by adding redundant data of a length of r×m×L bits calculated by using the encoding apparatus L times with respect to information data of a length of k×m×L bits, k×m-bit data calculated by inputting the information data of the length of k×m×L bits to the cyclic addition apparatus, and r×m-bit redundant data calculated by inputting the k×m-bit data to the encoding apparatus.

{Supplementary Note 7}

A program for causing a computer to function as:
an encoding apparatus for a quasi-cyclic low-density parity check code for calculating r×m-bit redundant data with respect to information data of a length of k×m bits m and r are positive integers), and a cyclic addition apparatus including a k×m-bit shift register and an exclusive OR;
wherein the computer includes a matrix data storing table for storing a plurality of parameters for specifying a computation method of the encoding apparatus and a plurality of parameters for specifying a computation method of the cyclic addition apparatus, and
wherein the program causes the computer to calculate, a length of (r×m×(L+1)+k×m) bits (L is a positive integer equal to or smaller than k) as redundant data by adding redundant data of a length of r×m×L bits calculated by using, L times with respect to information data of a length of k×m×L bits, maximum L+1 types of encoding apparatuses specified by parameters held in advance in the matrix data storing table, k×m-bit data calculated by inputting the information data of the length of k×m×L bits to maximum L types of cyclic addition apparatuses specified by parameters held in advance in the matrix data storing table, and r×m-bit redundant data calculated by inputting the k×m-bit data to an encoding apparatus specified by a parameter held in the matrix data storing table.

(Supplementary Note 8)

A transmission apparatus using the error correction encoding apparatus of any one of Supplementary notes 1 to 3.

(Supplementary Note 9)

The error correction encoding apparatus according to Supplementary note 3, wherein the first switch further outputs, by being switched, the information data of a length of k×m bits.

INDUSTRIAL APPLICABILITY

The present invention is applicable as an error correction technique for satisfying requirements in terms of system structures, such as reduction in the required power in satellite communications, data transmission extension in an optical communication system, and the like.

REFERENCE SIGNS LIST 1-1 Quasi-cyclic low-density parity check encoding apparatus
1-2 Cyclic addition apparatus
1-3, 1-4 Switch
3-1 Register
3-2, 3-3 Cyclic shift circuit
3-4 Selector
3-5 exclusive OR circuit
3-6 Memory
4-1 Register
4-2 exclusive OR
4-3 Cyclic shift circuit
5-1 Quasi-cyclic low-density parity check encoding apparatus
5-2 Cyclic addition apparatus
5-3, 5-4 Switch
5-6 Matrix data storing table

The invention claimed is:

1. An error correction encoding apparatus for calculating redundant data for error correction from information data, comprising:
an encoding apparatus for a quasi-cyclic low-density parity check code for calculating r×m-bit redundant data with respect to information data of a length of k×m bits (k, m and r are positive integers); and
a cyclic addition apparatus including a k×m-bit shift register and an exclusive OR,
wherein, the error correction encoding apparatus calculates data of a length of (r×m×(L+1)+k×m) bits (L is a positive integer equal to or smaller than k) as redundant data by adding redundant data of a length of r×m×L bits, k×m-bit data, and r×m-bit redundant data, the redundant data of a length of r×m×L bits being calculated by using the encoding apparatus L times with respect to information data of a length of k×m×L bits, the k×m-bit data being calculated by inputting the information data of the length of k×m×L bits to the cyclic addition apparatus, the r×m-bit redundant data being calculated by inputting the k×m-bit data to the encoding apparatus.

2. The error correction encoding apparatus according to claim 1, further comprising:
a matrix data storing table for storing a plurality of parameters for specifying a computation method of the encoding apparatus and a plurality of parameters for specifying a computation method of the cyclic addition apparatus,
wherein the error correction encoding apparatus calculates data of a length of (r×m×(L+1)+k×m) bits (L is a positive integer equal to or smaller than k) as redundant data by adding redundant data of a length of r×m×L bits, k×m-bit data, and r×m-bit redundant data, and wherein
the redundant data of a length of r×m×L bits are calculated by using, L times with respect to information data of a length of k×m×L bits, the encoding apparatus to which maximum (L+1) types of the computation methods are specified by parameters held in advance in the matrix data storing table,
the k×m-bit data are calculated by inputting the information data of the length of k×m×L bits to the cyclic addition apparatus to which maximum L types of the computation methods are specified by parameters held in advance in the matrix data storing table, and
the r×m-bit redundant data are calculated by inputting the k×m-bit data to the encoding apparatus to which the computation method is specified by a parameter held in the matrix data storing table.

3. The error correction encoding apparatus according to claim 1, further comprising:
a first switch for outputting an output of the cyclic addition apparatus or an output of the encoding apparatus; and
a second switch for inputting the information data of the length of k×m×L bits or the output of the cyclic addition apparatus to the encoding apparatus,
wherein the k×m-bit data is output, via the first switch, from the cyclic addition apparatus to which the information data of a length of k×m×L bits has been input, the information data of a length of k×m×L bits is input to the encoding apparatus via the second switch, and the redundant data of a length of r×m×L bits is generated and held at the encoding apparatus,
r×m×(L+1) redundant data is generated by adding, to the r×m×L-bit redundant data, r×m-bit redundant data generated by inputting the k×m-bit data from the cyclic addition apparatus to the encoding apparatus by switching the second switch, and
the r×m×(L+1) redundant data is output from the encoding apparatus by switching the first switch.

4. An error correction encoding method of an error correction encoding apparatus for calculating redundant data for error correction from information data, comprising:
    calculating data of a length of (r×m×(L+1)+k×m) bits (k, m, and r are positive integers, and L is a positive integer equal to or smaller than k) as redundant data by adding redundant data of a length of r×m×L bits calculated by applying the encoding of a quasi-cyclic low-density parity check code L times with respect to information data of a length of k×m×L bits, k×m-bit data calculated by cyclically adding the information data of the length of k×m×L bits, and r×m-bit redundant data calculated by applying the encoding of a quasi-cyclic low-density parity check code on the k×m-bit data.

5. The error correction encoding method according to claim 4, the error correction encoding apparatus comprising:
    an encoding apparatus for a quasi-cyclic low-density parity check code for calculating r×m-bit redundant data with respect to information data of a length of k×m bits (k, m and r are positive integers), a cyclic addition apparatus including a k×m-bit shift register and an exclusive OR, and a matrix data storing table for storing a plurality of parameters for specifying a computation method of the encoding apparatus for a quasi-cyclic low-density parity check code and a plurality of parameters for specifying a computation method of the cyclic addition apparatus,
    wherein the error correction encoding apparatus calculates data of a length of (r×m×(L+1)+k×m) bits (L is a positive integer equal to or smaller than k) as redundant data by adding redundant data of a length of r×m×L bits calculated by applying, L times with respect to information data of a length of k×m×L bits, maximum L+1 types of encoding of a quasi-cyclic low-density parity check code specified by parameters held in advance in the matrix data storing table, k×m-bit data calculated by performing maximum L types of cyclic addition specified by parameters held in advance in the matrix data storing table on the information data of the length of k×m×L bits, and r×m-bit redundant data calculated by applying encoding of a quasi-cyclic low-density parity check code specified by a parameter held in the matrix data storing table on the k×m-bit data.

6. A non-transitory computer-readable medium storing a program for causing a computer to function as:
    an encoding apparatus for a quasi-cyclic low-density parity check code for calculating r×m-bit redundant data with respect to information data of a length of k×m bits (k, m and r are positive integers), and a cyclic addition apparatus including a k×m-bit shift register and an exclusive OR,
    wherein the program causes the computer to calculate data of a length of (r×m×(L+1)+k×m) bits (L is a positive integer equal to or smaller than k) as redundant data by adding redundant data of a length of r×m×L bits calculated by using the encoding apparatus L times with respect to information data of a length of k×m×L bits, k×m-bit data calculated by inputting the information data of the length of k×m×L bits to the cyclic addition apparatus, and r×m-bit redundant data calculated by inputting the k×m-bit data to the encoding apparatus.

7. The non-transitory computer-readable medium according to claim 6,
    wherein the computer includes a matrix data storing table for storing a plurality of parameters for specifying a computation method of the encoding apparatus and a plurality of parameters for specifying a computation method of the cyclic addition apparatus, and
    wherein the program causes the computer to calculate, data of a length of (r×m×(L+1)+k×m) bits (L is a positive integer equal to or smaller than k) as redundant data by adding redundant data of a length of r×m×L bits calculated by using, L times with respect to information data of a length of k×m×L bits, the encoding apparatus to which maximum (L+1) types of the computation methods are specified by parameters held in advance in the matrix data storing table, k×m-bit data calculated by inputting the information data of the length of k×m×L bits to the cyclic addition apparatus to which maximum L types of the computation methods are specified by parameters held in advance in the matrix data storing table, and r×m-bit redundant data calculated by inputting the k×m-bit data to the encoding apparatus to which the computation method is specified by a parameter held in the matrix data storing table.

8. The error correction encoding apparatus according to claim 2, further comprising:
    a first switch for outputting an output of the cyclic addition apparatus or an output of the encoding apparatus; and
    a second switch for inputting the information data of the length of k×m×L bits or the output of the cyclic addition apparatus to the encoding apparatus,
    wherein the k×m-bit data is output, via the first switch, from the cyclic addition apparatus to which the information data of a length of k×m×L bits has been input, the information data of a length of k×m×L bits is input to the encoding apparatus via the second switch, and the redundant data of a length of r×m×L bits is generated and held at the encoding apparatus,
    r×m×(L+1) redundant data is generated by adding, to the r×m×L-bit redundant data, r×m-bit redundant data generated by inputting the k×m-bit data from the cyclic addition apparatus to the encoding apparatus by switching the second switch, and
    the r×m×(L+1) redundant data is output from the encoding apparatus by switching the first switch.

9. The error correction encoding apparatus according to claim 3, wherein the first switch further outputs, by being switched, the information data of a length of k×m bits.

10. The error correction encoding apparatus according to claim 8, wherein the first switch further outputs, by being switched, the information data of a length of k×m bits.

* * * * *